United States Patent [19]

De Barros et al.

[11] Patent Number: 4,717,989

[45] Date of Patent: Jan. 5, 1988

[54] HEAT SINK, EMI SHIELD AND CONTROLLER MODULE ASSEMBLY FOR A PORTABLE RADIO TRANSCEIVER

[75] Inventors: Leonardo G. De Barros, Plantation, Fla.; Thomas E. Buss, Singapore, Singapore; Adrian T. G. How, Singapore, Singapore; Jolene L. S. Tin, Singapore, Singapore

[73] Assignee: Motorola Inc., Schaumburg, Ill.

[21] Appl. No.: 31,963

[22] Filed: Mar. 30, 1987

[51] Int. Cl.$^4$ .............................................. H05K 9/00
[52] U.S. Cl. .................... 361/424; 361/388; 361/395; 439/77; 455/350; 455/351
[58] Field of Search ............... 439/76, 77; 174/68.5, 174/35 R, 51; 455/128, 300, 301, 347, 348, 350, 351; 361/380, 386–388, 391, 395, 398, 399, 413, 414, 422, 424

[56] References Cited

U.S. PATENT DOCUMENTS

| | | | |
|---|---|---|---|
| 4,064,552 | 12/1977 | Angelucci | 361/414 |
| 4,115,838 | 9/1978 | Yagusic | 361/388 |
| 4,394,530 | 7/1983 | Kaufman | 361/388 |
| 4,494,095 | 1/1985 | Noji | 455/301 |
| 4,509,098 | 4/1985 | DasGupta | 361/398 |
| 4,621,373 | 11/1986 | Hodsdon | 455/128 |

Primary Examiner—G. P. Tolin
Attorney, Agent, or Firm—Martin J. McKinley; Joseph T. Downey; Mark P. Kahler

[57] ABSTRACT

A controller module includes a cast module base having a central recess with a peripheral ledge. A cover plate is positioned in the recess and supported by the ledge. A flexible circuit is attached to the inside surface of the cover plate and includes two integral flexible circuit connectors. One connector protrudes through an opening in the side of the module base while the second connector wraps around an edge of the cover plate and is adhesively bonded to the outside surface of the cover plate. The flexible circuit includes a polyimide substrate with electrical circuit patterns disposed on opposite sides of the substrate. A polyimide cover layer is adhesively bonded over one electrical circuit pattern and the cover layer is then adhesively bonded to the inside surface of the cover plate. A solder resist layer is applied over portions of the other electrical circuit pattern leaving exposed areas for soldering and electrical contact. For heat sinking, the module base includes an aperture and a hole suitable for attaching the stud of an RF power transistor. A front cover includes a speaker which is temporarily held in place by a circumferential ridge. A rubber spacer is positioned between the underside of the module base and the speaker to securely hold the speaker in place.

6 Claims, 4 Drawing Figures

HEAT SINK, EMI SHIELD AND CONTROLLER MODULE ASSEMBLY FOR A PORTABLE RADIO TRANSCEIVER

BACKGROUND OF THE INVENTION

This invention relates to the field of portable radio transceivers, and more particularly to a portable radio transceiver that includes a programmable controller module.

The trend in portable radio transceiver design has been to use a digital controller to control the functions of the radio, especially in more sophisticated radios such as frequency synthesized and "trunked" radios. The limited space available in a small portable radio requires that the radio and controller be in close proximity, resulting in electromagnetic shielding problems. In particular, sensitive radio receiver parts must be electromagnetically shielded from the controller, and the controller itself must be shielded from any high power radio frequency transmitter circuits. The limited size of the radio also creates additional problem, including structural and heat transfer problems.

SUMMARY OF THE INVENTION

Briefly, the invention is a module for a portable radio and includes an electrically conductive cover plate that has inside and outside surfaces. A thermally and electrically conductive module base has a recess that is sized and shaped to receive the cover plate. The recess includes a ledge for supporting the cover plate above the floor of the module recess. The cover plate is attached to and electrically connected to the module base over the recess. A flexible circuit includes a substrate layer that has first and second electrical circuit patterns on opposite sides of the substrate layer. A cover layer is adhesively bonded over the first electrical circuit pattern and a solder resist layer is positioned over a portion of the second electrical circuit pattern. The flexible circuit is attached to the inside surface of the cover plate. The flexible circuit is electromagnetically shielded by the module base and cover plate.

DESCRIPTION OF THE PREFERRED EMBODIMENT

Figure 1:
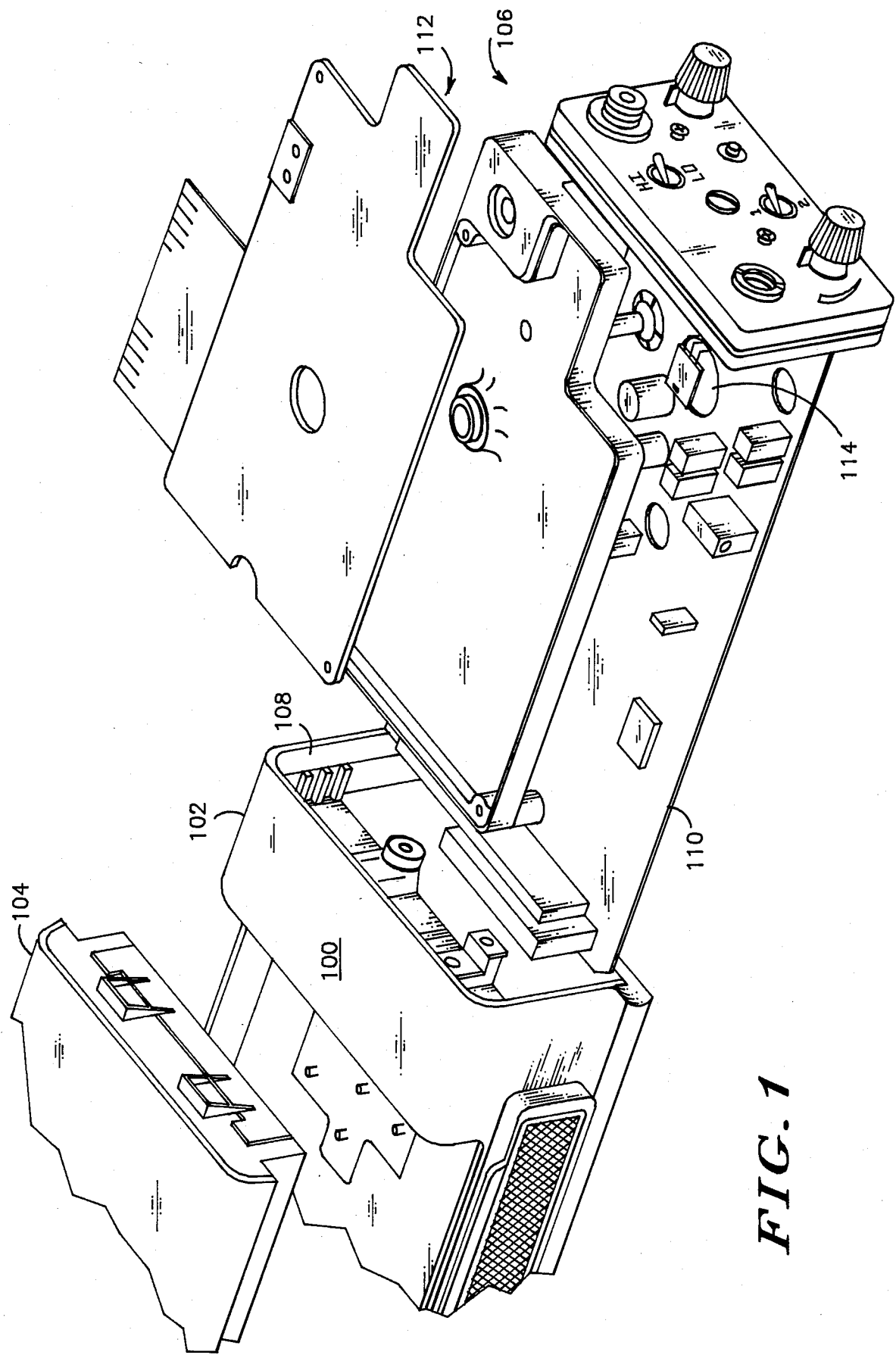
FIG. 1 is an exploded perspective view of a portable radio including the controller module of the present invention.

Referring to FIG. 1, a portable radio, generally designated 100, includes a main radio housing 102 and a battery pack 104 which attaches to the rear side of main housing 102. A circuit subassembly, generally designated 106, slides into main housing 102 through an opening 108 in the top of the housing. Circuit subassembly 106 includes a main printed circuit board 110 to which a controller module, generally designated 112, is attached. Controller module 112 will be described in greater detail below in connection with FIG. 2.

Figure 2:
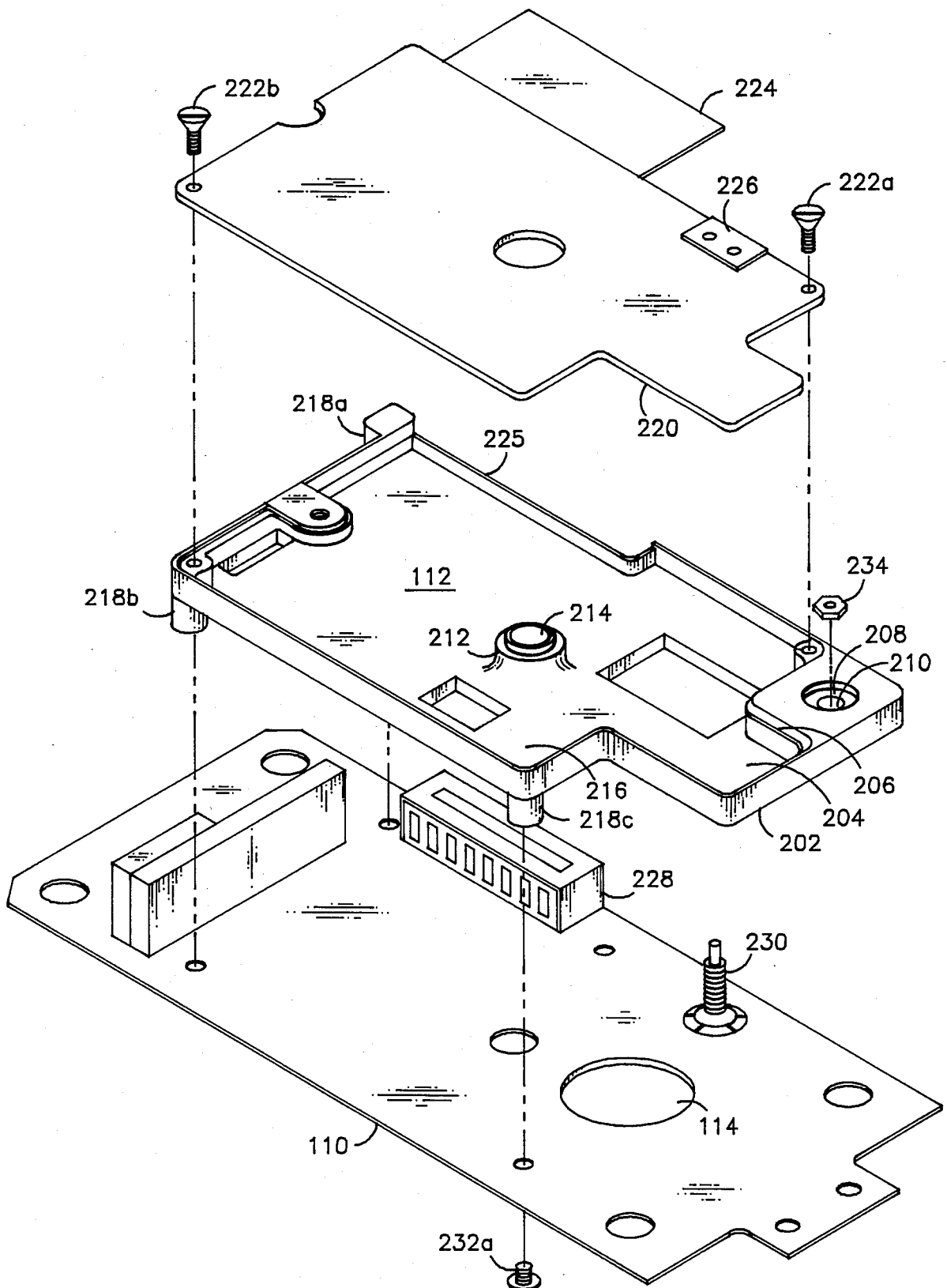
FIG. 2 is an exploded perspective view of the controller module showing its attachment to a main circuit board.

Referring to FIG. 2, controller module 112 includes a thermally and electrically conductive module base 202 which is preferably cast from ZAMAK #3 ASTM AG40A. Module base 202 includes a recess 204 wherein the walls of the recess include a ledge 206; the upper surface of the ledge being formed slightly below the upper surface of module base 202. In one corner of module base 202 is an aperture 208 that includes a central hole 210 that extends through the module base. A collar 212 having a central hole 214 is attached to the floor 216 of module base 202. Module base 202 also includes five legs, however, only legs 218a, b and c are visible in the figure.

An electrically conductive cover plate 220 is sized to fit in recess 204 of module base 202. Cover plate 220 is supported by ledge 206 and is secured to the module base through screws 222a and b. Cover plate 220 may be constructed from 0.79 mm thick SPCC carbon steel and preferably nickel plated. In the alternative, cover plate 220 may be constructed from an FR4 laminate, such as the type used in printed circuit board construction, having a 0.05 mm thick copper ground plane on the inside surface of the cover plate (the surface facing floor 216 of recess 204). A flexible circuit (not visible in FIG. 2) is adhesively bonded to the inside surface of cover plate 220.

Figure 3:
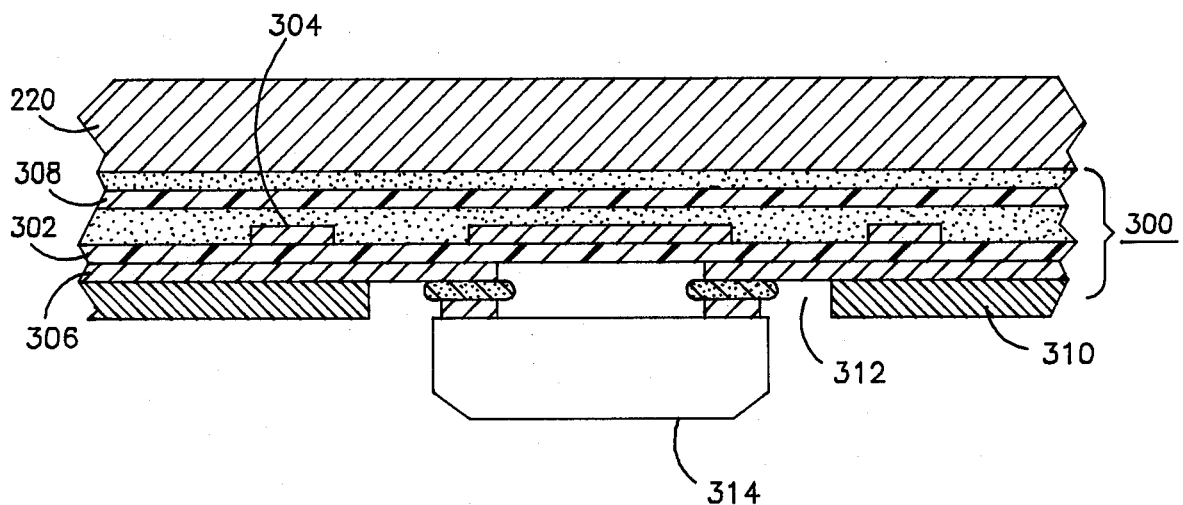
FIG. 3 is a cross sectional view of the module cover plate with attached flexible circuit.

In FIG. 3, a typical sectional view of cover plate 220 showing a cross section of the flexible circuit 300 is illustrated. Referring to this figure, a flexible circuit substrate 302 has first and second electrical circuit patterns 304 and 306 disposed on opposing surfaces of the substrate. A flexible cover layer 308 is adhesively bonded to substrate 302 over first electrical circuit pattern 304. Substrate 302 and cover layer 308 are preferably constructed from 0.025 mm thick polyimide, such as Dupont KAPTON®. Electrical circuit pattern 304 and 306 are preferably constructed from 0.035 mm thick one ounce 99.9% pure soft rolled annealed copper. A layer of solder resist 310, preferably WARNOW SR1004 type solder resist, is disposed over portions of second electrical pattern 306. Portions of second electrical circuit pattern 306, e.g., soldering pad 312, remain exposed so that components, for example component 314, can be attached to the circuit pattern. Flexible circuit 300 includes two grounding tabs (i.e., exposed areas of second electrical circuit pattern 306 which are not covered by solder resist layer 310) at opposite corners which electrically connect the flexible circuit to module base 202 through screws 222a and b. Flexible electrical 300 is then bonded to the inside surface of cover plate 220 with a laminating adhesive such as Sony bond film T4100.

Returning to FIG. 2, flexible circuit 300 has first and second integral flexible circuit connectors which extend beyond the edge of cover plate 220. First connector 224 is a 25 pin connector which passes through an opening 225 in module base 202 and is inserted into receptacle 228. Second connector 226 wraps around one edge of cover plate 220 and is adhesively bonded to the outside surface of cover plate 220. Main circuit board 110 includes an RF power transistor, for example a Motorola type MRF2628 transistor, which is packaged in a well known stud mounted package. Module base 202 is attached to main circuit board 110 with five screws, however, only screw 232a is illustrated in the figure. These screws are inserted through holes in main circuit board 110 and then threaded into holes located on the underside of the mounting legs of module base 202. The mounting stud of power transistor 230 is inserted through hole 210 in module base 202 and secured to the mounting base by nut 234. The large mass of module base 202 provides heat dissipation for RF power transistor 230.

Figure 4:
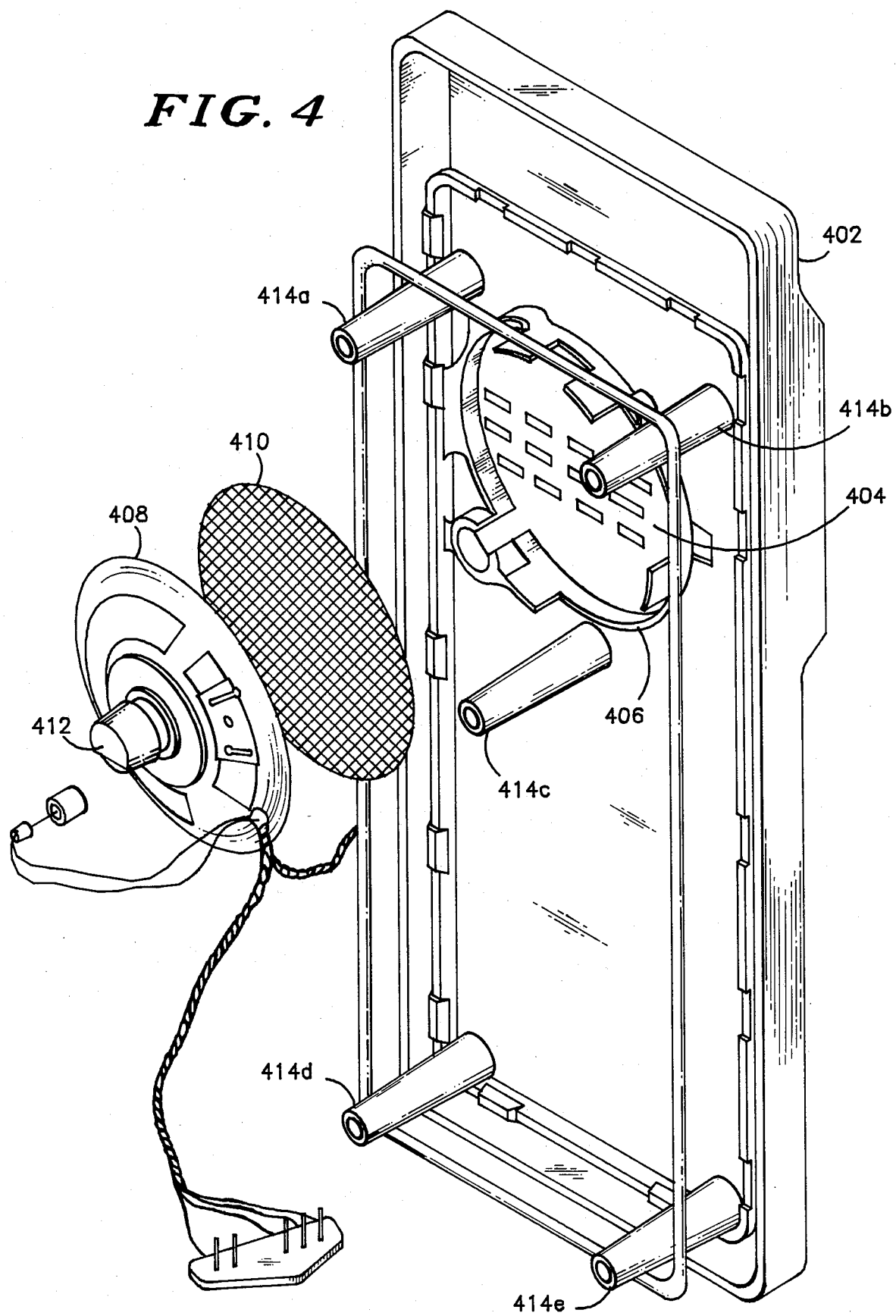
FIG. 4 is an exploded perspective view of the radio cover and speaker.

In FIG. 4, an exploded perspective view of the radio front cover and speaker is illustrated. Referring to this figure, a radio front cover 402 includes a speaker grill 404 which is surrounded on the inside of the front cover by a peripheral ridge 406. A permanent magnet speaker 408 and cloth speaker grill 410 are positioned against the inside of speaker grill 404 and temporarily retained to the front cover by press fitting the speaker within peripheral ridge 406. Front cover 402 has five legs 414a-e with threaded holes for attaching the front cover to radio housing 102. A rubber pad 412 contacts the lower surface of module base 202 when the radio is completely assembled, thereby permanently holding speaker 408 in position against the inside of speaker grill 404. Momentarily referring to FIGS. 1 and 2, rubber spacer 412 is inserted through hole 114 in main circuit board 110, whereupon it contacts the underside of module base 202.

In summary, controller module 112 is mounted above main circuit board 110 by screws (e.g., 132a) and legs (e.g., 218a). Radio receiver and transmitter components are mounted to main circuit board 110 underneath controller module 112. Module base 202 and cover plate 220 provide an electromagnetic shield between main radio board 110 and the controller module components, for example 314, which are mounted to flexible circuit 300. Controller module 112 also functions as a heat sink for RF power transistor 230, and structurally, serves to hold speaker 408 firmly against the inside surface of front cover 402. In addition, module 112 can be tested as a separate unit apart from main printed circuit board 112.

We claim as our invention:

1. A module for a portable radio, said module comprising in combination:

an electrically conductive cover plate having inside and outside surfaces;
a thermally and electrically conductive module base having a recess sized and shaped to receive said cover plate, said recess including a ledge for supporting said cover plate above the floor of said module recess, said cover plate being attached and electrically connected to said module base over said recess;
a flexible circuit including a substrate layer having first and second electrical circuit patterns on opposite sides of said substrate layer, a cover layer adhesively bonded over said first electrical circuit pattern, and a solder resist layer over a portion of said second electrical circuit pattern, said flexible circuit being attached to the inside surface of said cover plate;
whereby said flexible circuit is electromagnetically shielded by said module base and cover plate.

2. The module of claim 1, wherein:
said flexible circuit includes a first integral flexible circuit connector; and
said module base includes an opening, said first flexible circuit connector passing through said opening.

3. The module of claim 2, wherein:
said flexible circuit includes a second integral flexible circuit connector, said second connector wrapping around an edge of said cover plate and being attached to said outside surface of said cover plate.

4. The module of claim 1, wherein said module base includes a plurality of legs for supporting said module base above and attaching said module base to a main circuit substrate.

5. The module of claim 1, wherein said module base includes means for attaching a heat generating component to said module base, whereby said module base functions as a heat sink for said heat generating component.

6. The module of claim 1, wherein said flexible circuit includes electrical grounding contacts in electrical contact with said module base.

* * * * *